(12) United States Patent
Lee

(10) Patent No.: US 6,436,817 B2
(45) Date of Patent: Aug. 20, 2002

(54) METHOD FOR MANUFACTURING A COPPER INTERCONNECTION WITH AN ALUMINUM OXIDE-CONDUCTIVE LAYER STACK BARRIER LAYER IN SEMICONDUCTOR MEMORY DEVICE

(75) Inventor: Suk-Jae Lee, Kyoungki-do (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/740,945

(22) Filed: Dec. 21, 2000

(30) Foreign Application Priority Data

Dec. 29, 1999 (KR) ............................... 99-65015

(51) Int. Cl.⁷ ..................... H01L 21/4763; H01L 21/44
(52) U.S. Cl. ..................... 438/643; 438/653; 438/687
(58) Field of Search ................................ 438/687, 653, 438/643, 623

(56) References Cited

U.S. PATENT DOCUMENTS 5,736,192 A * 4/1998 Okamoto ..................... 427/99
5,783,483 A * 7/1998 Gardner ..................... 438/627
6,188,135 B1 * 2/2001 Chan et al. ................. 257/751
6,268,291 B1 * 7/2001 Andricacos et al. ........ 438/694

FOREIGN PATENT DOCUMENTS

JP 11-204524 A * 7/1999

* cited by examiner

*Primary Examiner*—Olik Chaudhuri
*Assistant Examiner*—Erik Kielin
(74) *Attorney, Agent, or Firm*—Finnegan, Henderson, Farabow, Garrett & Dunner, L.L.P.

(57) ABSTRACT

A method for manufacturing a copper interconnection includes the steps of preparing an active matrix provided with a substrate, an insulating layer and an opening formed with a predetermined shape through the insulating layer, forming a first aluminum oxide layer on surfaces of the opening and the insulating layer, forming a first conductive barrier layer on the first aluminum oxide layer, forming a copper layer into the opening and on the first conductive barrier layer, polishing back the copper layer to a top surface of the insulating layer, thereby obtaining a copper interconnection within the opening and a first double diffusion barrier layer provided with the first aluminum oxide layer and the first conductive barrier layer, and forming a second diffusion barrier layer on the copper interconnection and the insulating layer.

8 Claims, 7 Drawing Sheets

METHOD FOR MANUFACTURING A COPPER INTERCONNECTION WITH AN ALUMINUM OXIDE-CONDUCTIVE LAYER STACK BARRIER LAYER IN SEMICONDUCTOR MEMORY DEVICE

CROSS-REFERENCE TO RELATED APPLICATIONS

Priority is claimed from Republic of Korea Patent Application No. 199-65015 filed Dec. 29, 1999.

FIELD OF THE INVENTION

The present invention relates to a semiconductor device; and, more particularly, to a method for manufacturing a copper interconnection provided with double diffusion barrier layers which are formed before and after a formation of the copper interconnection respectively, thereby preventing the diffusion of copper atoms effectively.

DESCRIPTION OF THE PRIOR ART

With a high integration of a semiconductor device, a copper interconnection is being applied to the device due to its low electrical resistance property. For employing the copper interconnection in the semiconductor device, a damascene process is used because dry-etching process cannot be applied directly to deposit a copper interconnection layer in a damascene pattern.

Referring to FIGS. 1A to 1D, there are provided cross sectional views setting forth a conventional method for manufacturing the copper interconnection by using a damascene process.

The manufacturing steps begin with a preparation of active matrix 110 provided with a substrate 110, an insulating layer 112 and a contact region 111. The insulating layer 112, is formed on top of the substrate 110 and then patterned into a predetermined configuration by using a damascene process, thereby obtaining a shallow opening 116 for a metal interconnection and a deep opening for a contact. Thereafter, a diffusion barrier layer 114 is formed on entire surface including the openings 116, 118 and the insulating layer 112 for preventing a penetration of copper atoms into the insulating layer 112. The diffusion barrier layer is made of a material such as TiSiN, Ta, TaN, WSiN, WN or the like.

In a next step as shown in FIG. 1B, a first copper layer 120 is formed on the diffusion barrier layer 114 by using a method such as a physical vapor deposition (PVD) technique at a room temperature.

In a subsequent step as shown in FIG. 1C, a second copper layer is formed on the first copper layer 120 for reflowing the copper atoms into the openings 116, 118 by using the PVD technique at a high temperature.

Finally, a copper layer is polished back to a top surface of the insulating layer 112, thereby obtaining a copper interconnection 124 being remained within the openings 116, 118 and a diffusion barrier 114A as shown in FIG. 1D. Here, polishing back of the copper layers 120, 122 and the diffusion barrier layer 114 is accomplished by a chemical mechanical polishing (CMP) technique.

In the conventional method for manufacturing the copper interconnection, a single diffusion barrier layer, e.g., TiSiN, Ta, WSiN, WN or the like, is employed. However, in case that there are defects in the single diffusion barrier layer, the copper atoms may diffuse through these defects that a characteristic of the semiconductor device is deteriorated eventually.

SUMMARY OF THE INVENTION

It is, therefore, an object of the present invention to provide a method for manufacturing a copper interconnection provided with a double barrier layer, thereby preventing the diffusion of copper atoms effectively.

In accordance with one aspect of the present invention, there is provided a method for manufacturing a copper interconnection, the method comprising the steps of: a) preparing an active matrix provided with a substrate, an insulating layer and an opening formed with a predetermined shape through the insulating layer; b) forming a first aluminum oxide layer on surfaces of the opening and the insulating layer; c) forming a first conductive barrier layer on the first aluminum oxide layer; d) forming a copper layer into the opening and on the first conductive barrier layer; e) polishing back the copper layer to a top surface of the insulating layer, thereby obtaining a copper interconnection within the opening and a first double diffusion barrier layer provided with the first aluminum oxide layer and the first conductive barrier layer; and f) forming a second diffusion barrier layer on the copper interconnection and the insulating layer.

BRIEF DESCRIPTION OF THE DRAWINGS

The above and other objects and features of the present invention will become apparent from the following description of the preferred embodiment given in conjunction with the accompanying drawings, in which.

DETAILED DESCRIPTION OF THE PREFERRED EMBODIMENTS

Figure 1A:
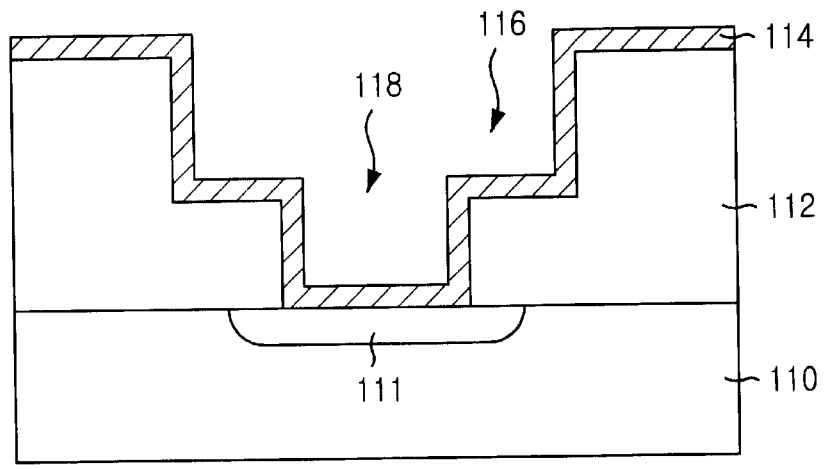
FIGS. 1A, 1B, 1C and 1D are cross sectional views setting forth a conventional method for manufacturing a copper interconnection.
Figure 1B:
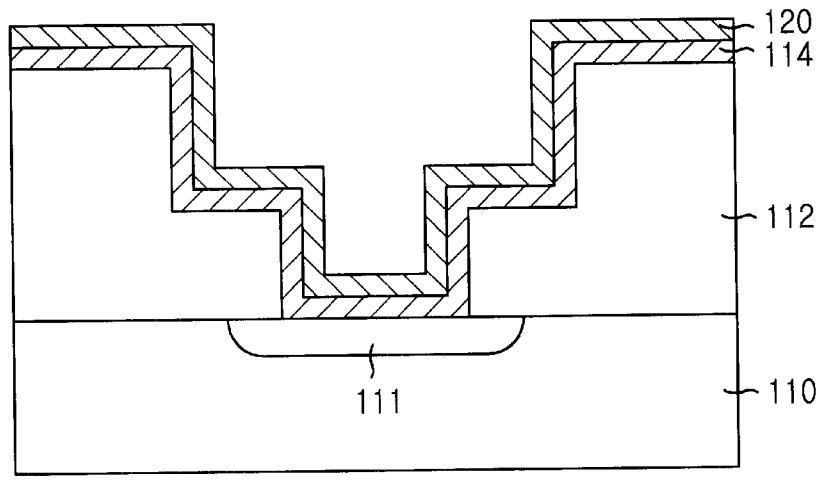
Figure 1C:
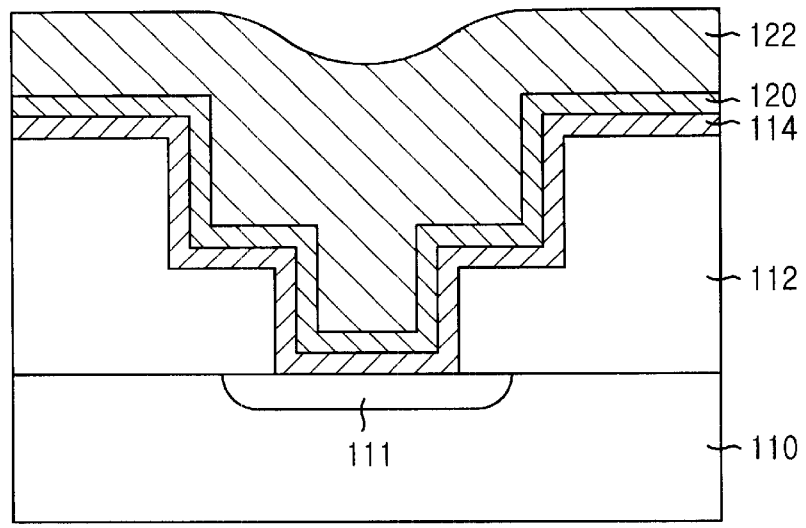
Figure 1D:
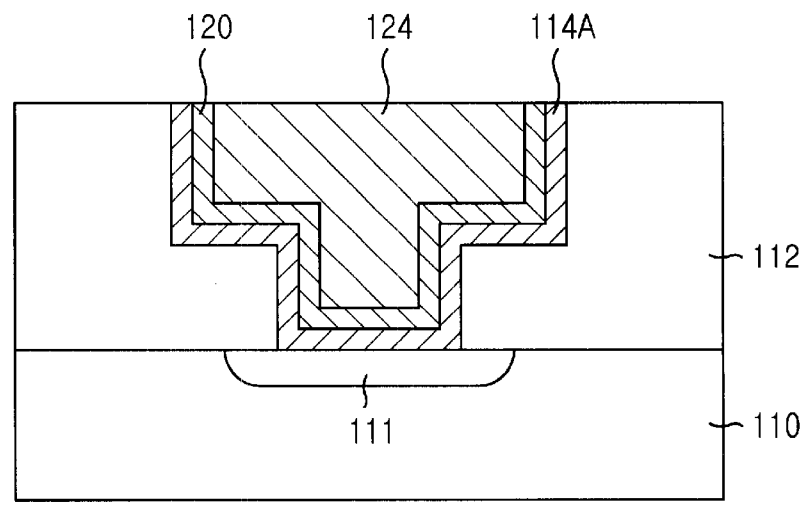

Referring to FIGS. 2A to 2F, there are provided cross sectional views setting forth a method for manufacturing a copper interconnection in a semiconductor device in accordance with a preferred embodiment of the present invention.

The manufacturing steps begin with a preparation of an active matrix 201 provided with a substrate 210, a contact region 211 and a first insulation layer 212 formed on the substrate 210. And then, the first insulating layer 212 is patterned into a predetermined configuration by using a damascene process, thereby obtaining a shallow opening 216 for a metal interconnection and a deep opening for a contact. Thereafter, an aluminum ions ($Al^{3+}$) 214 are doped into surfaces including the openings 216, 218, and the first insulating layer to a thickness ranging from approximately 10 Å to approximately 50 Å by accelerating the aluminum ions in an applied electric field.

Figure 2A:
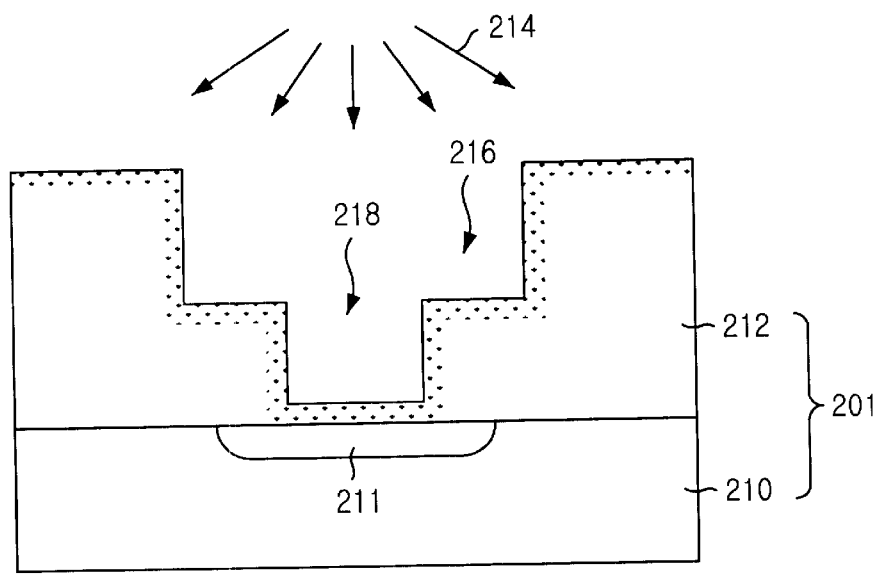
FIGS. 2A, 2B, 2C, 2D, 2E, 2F, 3A, 3B, 4A, and 4B are cross sectional views setting forth a method for manufacturing a copper interconnection in accordance with a preferred embodiment of the present invention.
Figure 2B:
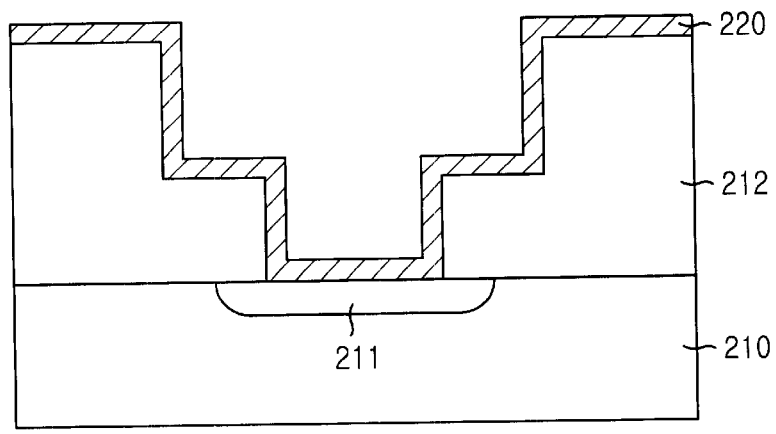

In an ensuing step as shown in FIG. 2B, a rapid thermal annealing (RTA) or a thermal treatment in a furnace is carried out at approximately 300° C. to approximately 500° C. for forming a first aluminum oxide layer 220 by reacting the doped aluminum ions and the first insulating layer 212, wherein the first insulating layer 212 is, for example, made of boron-phosphor silicate glass (BPSG) or the like. The first aluminum oxide layer 220 forms a portion of a first barrier layer. Here, the thermal treatment may be performed by heating up a wafer while the aluminum ions are being doped or after the aluminum ions have been completely doped.

Figure 2C:
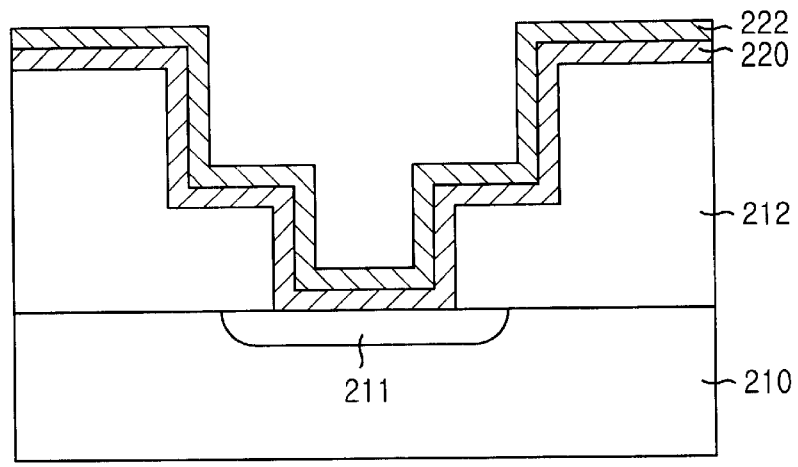

In a next step as shown in FIG. 2C, a first conductive barrier layer 222, e.g., made of TiSiN, Ta, TaN, WSiN or the like, is formed on top of the first aluminum oxide layer 220 for preventing copper atoms to diffuse into the first insulating layer 212 effectively.

Figure 2D:
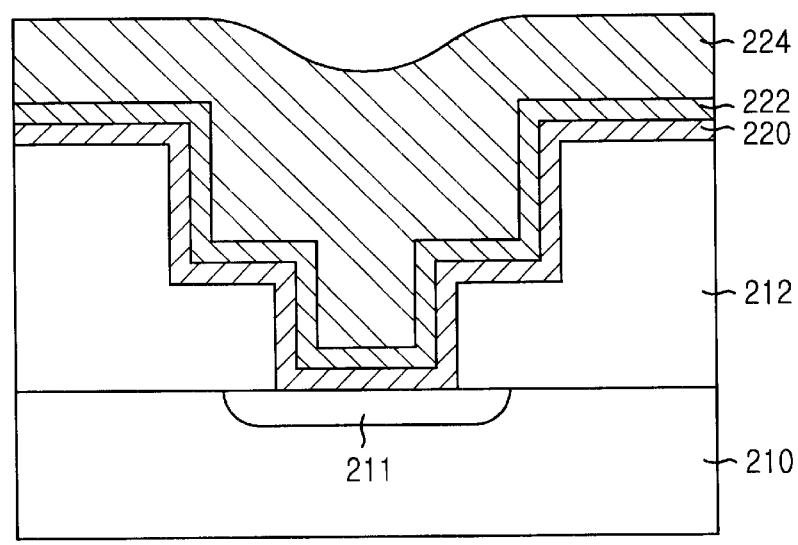

In a subsequent step as shown in FIG. 2D, copper is deposited into the openings 216, 218 and over the insulating layer 212. Generally, the copper deposition is carried out through two steps. That is, a first copper layer (not shown) and a second copper layer (not shown) are deposited subsequently, for improving a gap filling capability, by using the PVD technique.

Figure 2E:
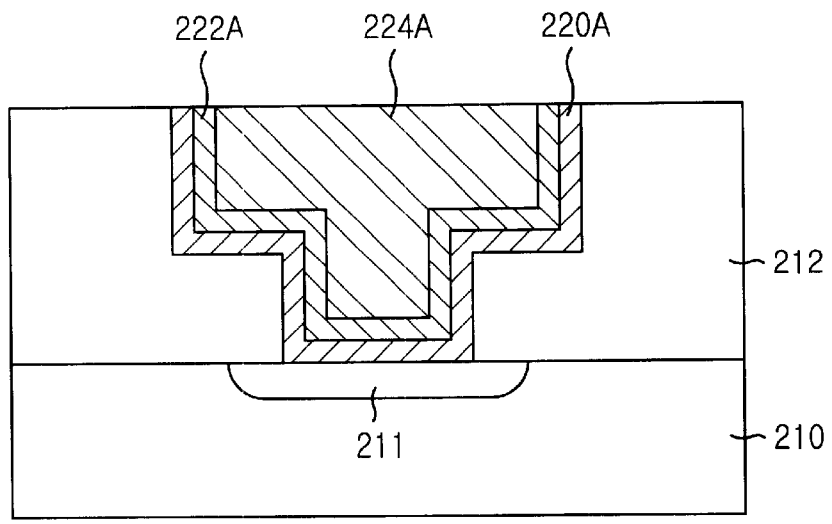

Thereafter, a copper layer 224 is polished back to a top surface of the first insulating layer 212, thereby forming a copper interconnection 224A being remained within the openings 216, 218 and a first double diffusion barrier 220A, 222A as shown in FIG. 2E. Polishing back of the copper layer 224 is accomplished by a chemical mechanical polishing (CMP).

Figure 2F:
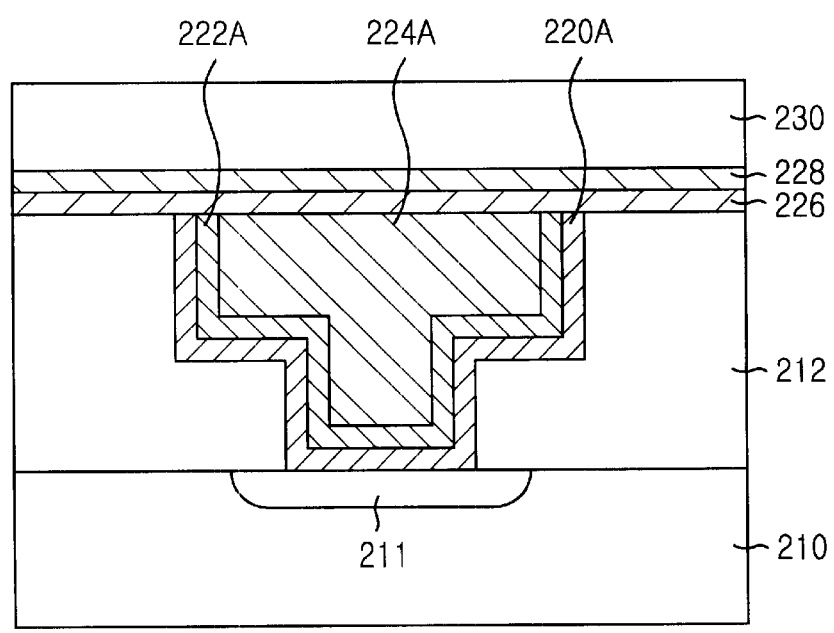

Finally, a second conductive barrier layer 226, a second aluminum oxide layer 228 and a second insulating layer 230 are formed on the copper interconnection 224A and the first insulating layer 212 subsequently, as shown in FIG. 2F. Before forming the second conductive barrier layer 226, an oxide film (not shown) remained on the copper interconnection 224A may be removed by using a method such as a sputtering technique. The second aluminum oxide layer 228 is formed by depositing aluminum ions on the second conductive barrier layer 226 to a thickness ranging from approximately 20 Å to approximately 100 Å and then, a thermal treatment, e.g., the RTA or the thermal treatment in the furnace, is carried out in order to form the second aluminum oxide layer 228 as same way as that of the first aluminum oxide layer 220. Therefore, a second double diffusion barrier layer is obtained.

Figure 3A:
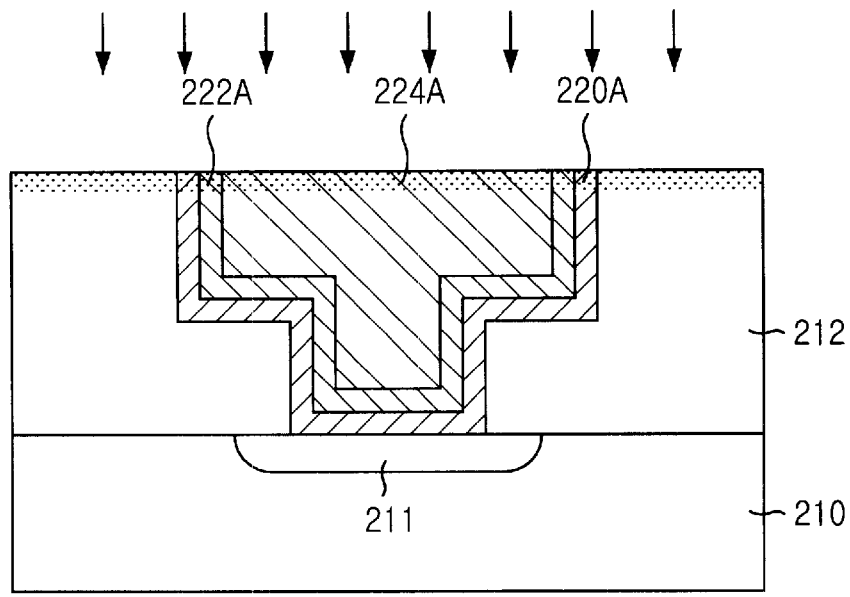
Figure 3B:
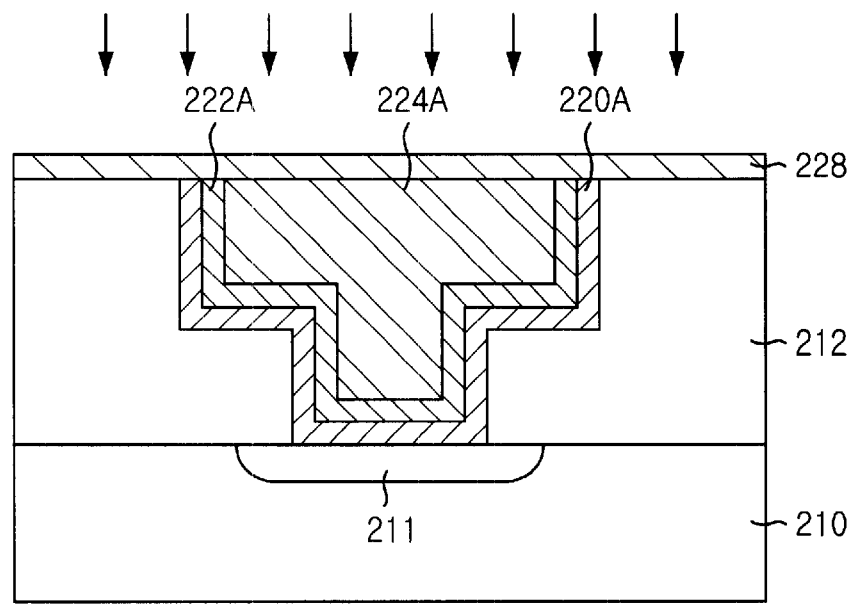
Figure 4A:
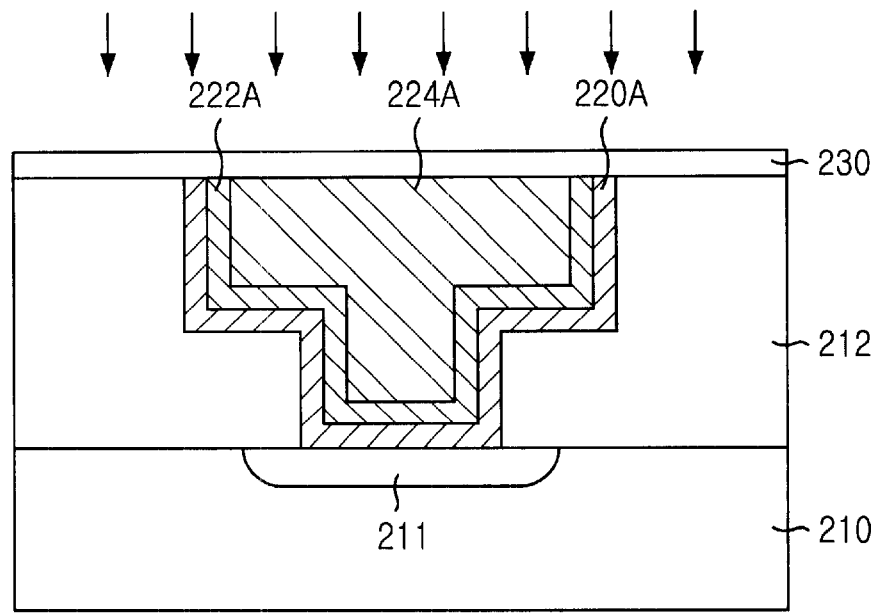
Figure 4B:
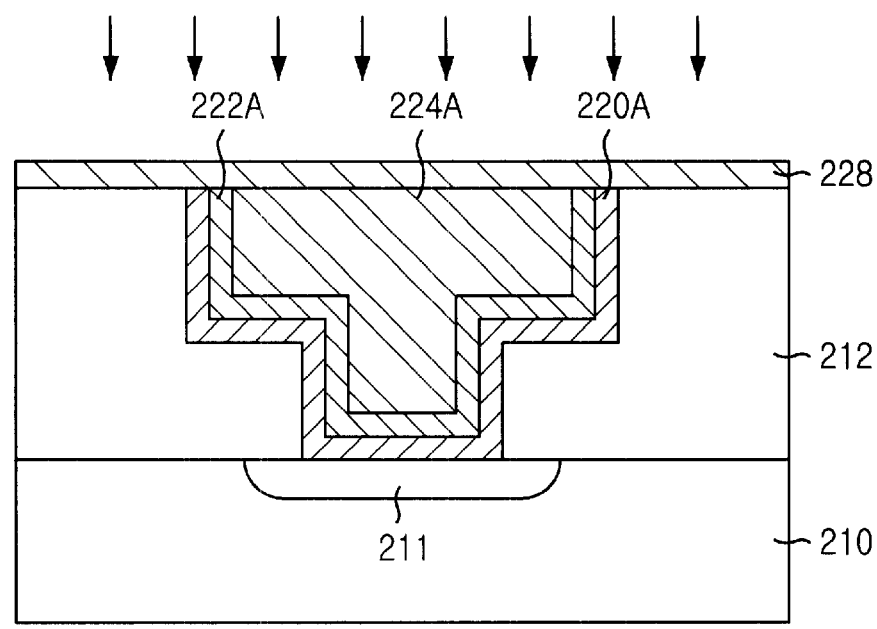

In the embodiment of the present invention, the second double diffusion barrier layer 226, 228 is used in the device, but only the second aluminum oxide layer 228 can be substituted for the second double diffusion barrier layer 226, 228. At this time, the second aluminum oxide layer 228 may be formed by the annealing step after the aluminum ions are doped on the copper interconnection 224A and the first insulating layer 212 to the thickness ranging from approximately 20 Å to approximately 100 Å, as shown in FIGS. 3A and 3B. In addition, the aluminum oxide layer 228 may be formed by another method. That is, as shown in FIGS. 4A and 4B, the second aluminum oxide layer 228 can be formed by the annealing step after the aluminum ions are doped on an oxide film (not shown) to the [ ]thickness ranging from approximately 20 Å to approximately 100 Å, wherein the oxide film, e.g., made of $SiO_x$ or SiON, is formed on the copper interconnection 224A and the first insulating layer 212 in advance.

By means of the double barrier layers, i.e., the first and the second double diffusion barrier layers, it is possible to prevent the diffusion of the copper atoms effectively so that the reliability of the device can be improved in comparison with a prior art.

While the present invention has been described with respect to the particular embodiments, it will be apparent to those skilled in the art that various changes and modifications may be made without departing from the scope of the invention as defined in the following claims.

What is claimed is:

1. A method for forming an interconnection, comprising the steps of:

a) preparing an active matrix having a substrate, an insulating layer over the substrate, and an opening having a predetermined shape in the insulating layer;

b) forming a first aluminum oxide layer over exposed portions of the opening and the insulating layer;

c) forming a first conductive barrier layer over the first aluminum oxide layer, whereby a first barrier layer is composed of the first aluminum oxide layer and the first conductive barrier layer;

d) forming a copper layer substantially filling the opening and covering the first barrier layer;

e) polishing the copper layer to expose the insulating layer; and f) forming a second barrier layer composed of a second aluminum oxide layer and a second conductive barrier layer over the copper layer and the exposed insulating layer.

2. The method as recited in claim 1, wherein the step of forming a first aluminum oxide layer includes annealing after aluminum ions ($Al^{3+}$) are doped into the insulating layer and the opening.

3. The method as recited in claim 2, wherein the aluminum ions are doped into the insulating layer and the opening to a thickness ranging from approximately 10 Å to approximately 50 Å by accelerating the aluminum ions in an applied electric field.

4. The method as recited in claim 2, wherein said annealing includes a rapid thermal annealing (RTA) or thermal annealing in a furnace.

5. The method as recited in claim 4, wherein the rapid thermal annealing (RTA) or thermal annealing is carried out at a temperature ranging from approximately 300° C. to approximately 500° C.

6. The method as recited in claim 1, wherein the first barrier layer includes a material selected from a group consisting of tantalum (Ta), tantalum nitride (TaN), titanium silicon nitride (TiSiN), and tungsten silicon nitride (WSiN).

7. The method as recited in claim 1, wherein the step of forming the second barrier layer includes forming the aluminum oxide layer by annealing after aluminum ions are doped into the copper layer and the insulting layer to a thickness ranging from approximately 20 Å to approximately 100 Å.

8. The method as recited in claim 1, wherein the second barrier layer includes a material selected from a group of consisting of Ta, TaN, TiSiN, and WSiN.

* * * * *